US009588426B2

(12) United States Patent
Wang et al.

(10) Patent No.: US 9,588,426 B2
(45) Date of Patent: *Mar. 7, 2017

(54) NEGATIVE PHOTORESIST AND METHODS OF PREPARING AND USING THE SAME (71) Applicant: BOE TECHNOLOGY GROUP CO., LTD., Beijing (CN)

(72) Inventors: Jianguo Wang, Beijing (CN); Hehe Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/428,143

(22) PCT Filed: Aug. 15, 2014

(86) PCT No.: PCT/CN2014/084519
§ 371 (c)(1),
(2) Date: Mar. 13, 2015

(87) PCT Pub. No.: WO2015/109827
PCT Pub. Date: Jul. 30, 2015

(65) Prior Publication Data
US 2015/0370168 A1 Dec. 24, 2015

(30) Foreign Application Priority Data
Jan. 26, 2014 (CN) .......................... 2014 1 0037970

(51) Int. Cl.
G03F 7/075 (2006.01)
G03F 7/004 (2006.01)
(Continued)

(52) U.S. Cl.
CPC .......... *G03F 7/0757* (2013.01); *G03F 7/0382* (2013.01); *G03F 7/0755* (2013.01);
(Continued)

(58) Field of Classification Search
None
See application file for complete search history.

(56) References Cited

U.S. PATENT DOCUMENTS 8,119,331 B2 2/2012 Baumann et al.
8,652,755 B2 2/2014 Hatanaka et al.
(Continued)

FOREIGN PATENT DOCUMENTS

CN 101379432 A 3/2009
CN 101666977 A 3/2010
(Continued)

OTHER PUBLICATIONS

Machine translation JP 2943172. Aug. 30, 1999.*
(Continued)

*Primary Examiner* — Cynthia H Kelly
*Assistant Examiner* — Alyssa L Cepluch
(74) *Attorney, Agent, or Firm* — Collard & Roe, P.C.

(57) ABSTRACT

Disclosed is a negative photoresist comprising 1 to 90 parts of hydroxyl-containing or carboxyl-containing film-forming resin, 1 to 99 parts of silicon-containing vinyl ether monomer, 0.1 to 15 parts by weigh of a crosslinking agent, and an organic solvent capable of dissolving the aforesaid substances. Disclosed is also methods of preparing and using the negative photoresist.

12 Claims, 1 Drawing Sheet (51) Int. Cl.
*G03F 7/16* (2006.01)
*G03F 7/20* (2006.01)
*G03F 7/32* (2006.01)
*G03F 7/038* (2006.01)

(52) U.S. Cl.
CPC ................ *G03F 7/16* (2013.01); *G03F 7/20* (2013.01); *G03F 7/32* (2013.01)

(56) References Cited

U.S. PATENT DOCUMENTS

| | | | |
|---|---|---|---|
| 9,091,920 B2 | 7/2015 | Sekito et al. | |
| 9,400,430 B2 | 7/2016 | Tsuchimura et al. | |
| 2002/0146642 A1 | 10/2002 | Kim et al. | |
| 2004/0023151 A1* | 2/2004 | Takeda | G03F 7/0382 430/270.1 |
| 2007/0048662 A1* | 3/2007 | Park | G03F 7/0382 430/270.1 |
| 2009/0061359 A1 | 3/2009 | Nozaki et al. | |

FOREIGN PATENT DOCUMENTS

| | | | | |
|---|---|---|---|---|
| CN | 102566277 A | 7/2012 | | |
| CN | 102741752 A | 10/2012 | | |
| CN | 103809378 A | 5/2014 | | |
| CN | 103941544 A | 7/2014 | | |
| EP | 0624827 A1 * | 11/1994 | ............ | C07F 7/0847 |
| JP | H 03-130774 A | 6/1991 | | |
| JP | 2943172 B2 * | 8/1999 | | |
| JP | 2007171754 A | 7/2007 | | |
| JP | 2012-242600 A | 12/2012 | | |
| WO | 2013/069812 A1 | 5/2013 | | |

OTHER PUBLICATIONS

Machine translation EP 0624827. Nov. 17, 1994.*
International Search Report with Notice of Transmittal of the International Search Report of PCT/CN2014/084519 in Chinese, mailed Nov. 26, 2014.
Written Opinion of the International Searching Authority of PCT/CN2014/084519 in Chinese with English translation mailed Nov. 26, 2014.
Chinese Office Action in Chinese Application No. 201410037970.9, mailed Apr. 26, 2016 with English translation.
Second Chinese Office Action in Chinese Application No. 201410037970.9, mailed Sep. 20, 2016 with English translation.

* cited by examiner

NEGATIVE PHOTORESIST AND METHODS OF PREPARING AND USING THE SAME

CROSS REFERENCE TO RELATED APPLICATIONS

This application is the National Stage of PCT/CN2014/084519 filed on Aug. 15, 2014, which claims priority under 35 U.S.C. §119 of Chinese Application No. 201410037970.9 filed on Jan. 26, 2014, the disclosure of which is incorporated by reference.

TECHNICAL FIELD

Embodiments of the present invention relate to negative photoresists and methods of preparing and using such photoresists.

BACKGROUND

Photoresists are essential functional materials for photoetching in large-scale integrated circuit industries. Upon UV radiation, photoresists are subject to a series of chemical reactions so that the dissolution rate of the photoresists in a developer varies before and after exposure. Then, the photoresists undergo developing, hardening, etching, stripping, and the like, thereby transferring specific high-precision patterns onto surfaces of substrates to be treated.

With rapid development of large-scale integrated circuit industries, diversification of the integrated circuit products and types, and increasing improvement of the photoetching process, there is a continuing need of essential materials (especially, photoresists) for use in the photoetching process which have improved quality, diversity, and more professional properties.

The prior art technology requires pre-forming a silicon-containing polymer as the film-forming resin by the polymerization of silicon-containing acrylate-based monomers with silicon-free monomers. Such polymerization is hard to occur, and has a low yield. Thus, such silicon-containing film-forming resin has a relative production cost, and hence its practical use is highly limited.

SUMMARY OF INVENTION

To address the aforesaid technical problems, embodiments of the present invention provide negative photoresists and methods of preparing and using such photoresists, which can reduce the production cost, and allow the negative photoresist to be widely used in the practical production.

An embodiment of the present invention provides a negative photoresist comprising 1 to 90 parts by weight of a hydroxyl-containing or carboxyl-containing film-forming resin, 1 to 99 parts by weight of a silicon-containing vinyl ether monomer, 0.1 to 15 parts by weight of a crosslinking agent, and an organic solvent capable of dissolving the aforesaid substances.

In an aspect, the hydroxyl-containing film-forming resin comprises a phenolic hydroxyl-containing film-forming resin.

In another aspect, the carboxyl-containing film-forming resin comprises at least one selected from the group consisting of novolacs having pendant carboxyl groups, carboxyl-containing polyacrylate-based resins, and poly (vinyl acetal) carboxylic acid anhydride resin esters.

In still another aspect, the novolacs having pendant carboxyl groups conform to the general structural formula of:

wherein x may be 0 to 2, n may be 2 to 15, p may be 0 to 13, $R_1$ may be H or substituted or unsubstituted linear or branched $C_1$ to $C_9$ alkyl.

In yet another aspect, the silicon-containing vinyl ether monomer conforms to the general structural formula of:

wherein n may be 2 to 10, m may be 1 to 600, $R_1$ may be $C_1$ to $C_9$ alkyl.

In yet another aspect, the crosslinking agent conforms to the general structural formula of:

wherein $R_1$ may be $C_1$ to $C_8$ alkyl, $R_2$ may be H or $CH_3$.

In yet another aspect, the organic solvent may be 200 to 400 parts by weight.

In yet another aspect, the negative photoresist may further comprise total 0.1 to 10 parts by weight of a photoacid generator and a dye.

In yet another aspect, the photoacid generator is 0.1 to 0.4 parts by weight, and the dye is 0.3 or 0.4 parts by weight, based on total weight of the hydroxyl-containing or carboxyl-containing film-forming resin and the silicon-containing vinyl ether monomer in the negative photoresist.

In yet another aspect, the photoacid generator comprises at least one selected from the group consisting of onium-based, arene-cyclopentadienyl iron-based, oxime sulfate-based and triazine-based photoacid generators.

In yet another aspect, the negative photoresist comprises 1 to 5 parts by weight of the phenolic hydroxyl-containing or carboxyl-containing film-forming resin; 5 to 9 parts by weight of silicon-containing vinyl ether monomer; 0.2 to 0.5 parts by weight of the crosslinking agent; total 0.5 to 0.8 parts by weight of photoacid generator and the dye; and 300 to 340 parts by weight of organic solvent.

Another embodiment of the present invention provides a method of preparing a negative photoresist comprising dissolving 1 to 90 parts by weight of a hydroxyl-containing or carboxyl-containing film-forming resin, 1 to 99 parts by weight of a silicon-containing vinyl ether monomer, and 0.1 to 15 parts by weight of a crosslinking agent into an organic solvent capable of dissolving the aforesaid substances.

In an aspect, the hydroxyl-containing film-forming resin comprises a phenolic hydroxyl-containing film-forming resin.

In another aspect, the carboxyl-containing film-forming resin comprises at least one selected from the group consisting novolacs having pendant carboxyl groups, carboxyl-containing polyacrylate-based resins, and poly (vinyl acetal) carboxylic acid anhydride resin esters.

In yet another aspect, the novolacs having pendant carboxyl groups conform to the general structural formula of:

wherein x may be 0 to 2, n may be 2 to 15, p may be 0 to 13, $R_1$ may be H or substituted or unsubstituted linear or branched $C_1$ to $C_9$ alkyl.

In yet another aspect, the silicon-containing vinyl ether monomer conforms to the general structural formula of:

wherein n may be 2 to 10, m may be 1 to 600, $R_1$ may be $C_1$ to $C_9$ alkyl.

In yet another aspect, the crosslinking agent may conform to the general structural formula of:

wherein $R_1$ may be $C_1$ to $C_8$ alkyl, $R_2$ may be H or $CH_3$.

In yet another aspect, the organic solvent may be 200 to 400 parts by weight.

In yet another aspect, the method may further comprise adding total 0.1 to 10 parts by weight of a photoacid generator and a dye.

For instance, the photoacid generator is 0.1 to 0.4 parts by weight, and the dye is 0.3 or 0.4 parts by weight, based on total weight of the hydroxyl-containing or carboxyl-containing film-forming resin and the silicon-containing vinyl ether monomer in the negative photoresist.

In yet another aspect, the photoacid generator comprises at least one selected from the group consisting of onium-based, arene-cyclopentadienyl iron-based, oxime sulfate-based and triazine-based photoacid generators.

In yet another aspect, the method comprises dissolving 1 to 5 parts by weight of the phenolic hydroxyl-containing or carboxyl-containing film-forming resin, 5 to 9 parts by weight of the silicon-containing vinyl ether monomer, 0.2 to 0.5 parts by weight of the crosslinking agent, and total 0.5 to 0.8 parts by weight of the photoacid generator and the dye into 300 to 340 parts by weight of organic solvent.

Still another embodiment of the present invention discloses a method of using the negative photoresist comprising: applying the negative photoresists in accordance with the embodiments of the present invention onto a substrate to be treated; reacting the hydroxyl-containing or carboxyl-containing film-forming resin in the negative photoresist with the silicon-containing vinyl ether monomer to form a silicon-containing etherate photoresist film; exposing the formed silicon-containing etherate photoresist film so as to allow the Si—OR groups in the silicon-containing etherate to be first crosslinked with the crosslinking agent in the presence of the photoacid generator; and developing in a developer to produce a developed pattern.

DETAILED DESCRIPTION OF INVENTION

Hereinafter the technical solutions of embodiments of the present invention are clearly and completely described with reference to the drawings. It is apparent that the described examples are not all, but only a portion of examples of the present invention.

An embodiment of the present invention provides a negative photoresist comprising 1 to 90 parts by weight of a hydroxyl-containing or carboxyl-containing film-forming resin, 1 to 99 parts by weight of a silicon-containing vinyl ether monomer, 0.1 to 15 parts by weight of a crosslinking agent, and an organic solvent capable of dissolving the aforesaid substances.

In an aspect, the hydroxyl-containing film-forming resin comprises a phenolic hydroxyl-containing film-forming resin.

Alternatively, the carboxyl-containing film-forming resin comprises at least one selected from the group consisting of novolacs having pendant carboxyl groups, carboxyl-containing polyacrylate-based resins, and poly (vinyl acetal) carboxylic acid anhydride resin esters.

Preferably, the novolacs having pendant carboxyl groups conforms to the general structural formula of:

wherein x is 0 to 2, n is 2 to 15, p is 0 to 13, $R_1$ is H or substituted or unsubstituted linear or branched $C_1$ to $C_9$ alkyl. Preferably, when x is 1, n is 2 to 15, p is 3 to 13; and when x is 2, n is 4 to 15, p is 3 to 13.

As used herein, the term "alkyl" refers to a group derived from saturated linear hydrocarbon (i.e., alkane) by removal of a hydrogen atom. Preferably, $R_1$ may be unsubstituted linear or branched $C_1$-$C_9$ alkyl, more preferably, the alkyl may be substituted or unsubstituted methyl or n-butyl.

As used herein, the term "substituted" means that one or more hydrogen atoms in an alkyl group are replaced with one or more atoms or atomic groups (i.e., substituents). For instance, the substituent may be, e.g., but be not limited to, $C_1$ to $C_6$ alkyl, $C_1$ to $C_6$ alkoxy, halide atoms (e.g., fluorine, chlorine, bromine, or iodine), nitro, hydroxyl, carboxyl, cyano, and the like. Preferably, the substituents may be $C_1$ to $C_6$ alkyl, $C_1$ to $C_6$ alkoxy, fluorine, chlorine, bromine, hydroxyl, carboxyl, or the like.

The film-forming resin used in the embodiments of the present invention may be any suitable commercially available product, or can be synthesized in accordance with any known technology in the art. For instance, without limitation, a carboxyl-containing film-forming resin, e.g., carboxyl phenol-formaldehyde (PF) resin, can be synthesized as follows. A phenolic compound is added into an aqueous solution of formaldehyde, and then heated to a temperature of 60° C. to 95° C. After complete dissolution, a catalyst is added, and the mixture is reacted for 2 to 10 hours. The reaction mixture is distilled at an elevated temperature for removal of moisture until the resin becomes liquid, and then the desired carboxyl PF resin is produced.

In another aspect, the silicon-containing vinyl ether monomer conforms to the general structural formula of:

wherein, n is 2 to 10, m is 1 to 600, $R_1$ is substituted or unsubstituted linear or branched $C_1$ to $C_9$ alkyl. Of those, the substituted or unsubstituted linear or branched $C_1$ to $C_9$ alkyl are defined as above. Preferably, when n is 2, m is 1, 2 or 4; and when n is 3, m is 3.

The silicon-containing vinyl ether monomer may be any suitable commercially available product, or can be synthesized in accordance with any known technology in the art. For example, without limitation, divinylethersiloxane C: 1,7-di-(ethyleneoxy)-octamethyltetrasiloxane can be synthesized in line with the following scheme.

In a preferable aspect, the weight ratio of the phenolic hydroxyl-containing or carboxyl-containing film-forming resin to the silicon-containing vinyl ether monomer may be 1:9 to 1:1.

In another aspect, the crosslinking agent may conform to the general structural formula of:

wherein $R_1$ is $C_1$ to $C_3$ alkyl, $R_2$ is H or $CH_3$.

As an example, the crosslinking agent may be commercially available TMMGU (tetramethoxymethylglycoluril) having the structural formula of:

The crosslinking agent—tetramethoxymethylglycoluril, CAS number: 17464-88-9—may be commercially available from AK Scientific Co., Ltd.

In yet another aspect, any suitable organic solvent can be used in the photoresists in accordance with the embodiments of the present invention, as long as it can dissolve completely the hydroxyl-containing or carboxyl-containing film-forming resin and the silicon-containing vinyl ether monomer. For instance, the organic solvent can comprise, but are not limited to, at least one selected from the group consisting of: ethylene glycol monomethyl ether, ethylene glycol monoethyl ether, propylene glycol monoethyl ether, methyl ether ketone, butyl acetate, dioxane, N-methylpyrrolidone, methanol, tetrahydrofuran. The amount of the organic solvent depends on the consistency of the final photoresist, and are not strictly limited herein. Of course, for obtaining a photoresist having a suitable consistency in practice, it is preferable to use the organic solvent in an amount of 200 to 400 parts by weight.

Generally, in addition to the aforesaid components, the photoresists in accordance with the embodiments of the present invention can comprise additionally initiators and additives. Initiators serve primarily to initiate a reaction of the photoresist under light exposure or other reaction conditions. Optionally, the initiators may be a photoacid generator, and the additives may be a dye.

In another aspect, the photoresists in accordance with the embodiments of the present invention can further comprise total 0.1 to 10 parts by weight of a photoacid generator and a dye. For instance, in the case that the photoresist comprises total 10 parts by weight of the film-forming resin and the silicon-containing vinyl ether monomer, the photoacid generator may be 0.1 to 0.4 parts by weight, and the dye may be 0.3 or 0.4 parts by weight, Preferably, the weight ratio of the photoacid generator to the dye may be 1:1 to 1:4.

Generally, in addition to the aforesaid components, the photoresists in accordance with the embodiments of the present invention can comprise additionally initiators and additives. Initiators serve primarily to initiate a reaction of the photoresist under light exposure or other reaction conditions. Optionally, the initiators may be a photoacid generator, and the additives may be a dye.

In another aspect, the photoresists in accordance with the embodiments of the present invention can further comprise total 0.1 to 10 parts by weight of a photoacid generator and a dye. For instance, in the case that the photoresist comprises total 10 parts by weight of the film-forming resin and the silicon-containing vinyl ether monomer, the photoacid generator may be 0.1 to 0.4 parts by weight, and the dye may be 0.3 or 0.4 parts by weight, Preferably, the weight ratio of the photoacid generator to the dye may be 1:1 to 1:4.

Of those, the photoacid generator can comprise at least one selected from the group consisting of onium-based, arene-cyclopentadienyl iron-based, oxime sulfate-based or triazine-based photoacid generators.

The onium-based photoacid generator may have a general formula of $(Ar_n,Y)^+X^-$ wherein Ar is an aromatic group; Y is S or I; x is $SbF_6$, $AsF_6$, $PF_6$, $BF_4$ or $CF_3SO_3$; n is 2 or 3.

Alternatively, the photoacid generator can be one or more selected from the group consisting of onium-based photoacid generators A1-1 to A1-14:

A1-1

A1-2

A1-3

A1-4

-continued

A1-5

A1-6

A1-7

A1-8

A1-9

A1-10

A1-11

A1-12

A1-13 and

A1-14

The arene-cyclopentadienyl iron-based photoacid generator may have a general formula of:

wherein, is an aromatic group, R is methyl, isopropyl or benzyl; x is $SbF_6$, $AsF_6$, $PF_6$, $BF_4$ or $CF_3SO_3$.

Optionally, the photoacid generator may be one or more selected from the group consisting of the arene-cyclopentadienyl iron-based photoacid generators A2-1 to A2-10:

A2-1

A2-2

A2-3

A2-4

A2-5

A2-6

A2-7

A2-8

-continued

A2-9

, and

A2-10

.

The oxime sulfate-based photoacid generator may have a general formula of:

wherein, R₁ is

; R₂ is or —C≡N; wherein, $R_n$ is $C_{2-6}$ alkyl; Ar is phenyl; R₂ is an aromatic group; R₃ is an aromatic group or $C_{1-10}$ alkyl.

As used herein, the term "aromatic group" refers to substituted or unsubstituted monocyclic or multicyclic aromatic groups. Optionally, the aromatic group may be an aromatic group having 6 to 24 ring carbon atoms. Optionally, the aromatic group comprises, but is not limited to, phenyl, benzyl, phenoxy, p-phenol group, or p-phenylmethyl. Preferably, the substituents of the aromatic group may be linear or branched alkyl, preferably lower alkyl, For instance, $C_1$ to $C_4$ alkyl.

Optionally, the photoacid generator may be one or more selected from the group consisting of oxime sulfate-based photoacid generators A3-1 to A3-26:

A3-1

-continued

A3-2

A3-3

A3-4

A3-5

A3-6

A3-7

A3-8

A3-9

A3-10

A3-11

A3-12

A3-13

A3-14

A3-15

A3-16

A3-17

A3-18

A3-19

A3-20

A3-21

A3-22

A3-23

A3-24

A3-25

A3-26

The triazine-based photoacid generator has a general formula of:

wherein $R_4$ and $R_5$ are independently $C_{1-10}$ alkyl or electron-repelling conjugate group comprising, without limitation, benzyl, p-methylphenoxy, p-phenylmethyl, or the like.

Optionally, the photoacid generator may be one or more selected from the group consisting of the triazine-based photoacid generators A4-1 to A4-7:

The aforesaid photoacid generators may be any suitable commercially available product, e.g., those commercially available from YAW (Jingmen) Chemical Engineering Co., Ltd, and Liye (Handan Development Zone) Chemical Enginnering Co., Ltd.

The dye suitable for used in the embodiments of the present invention can comprise, but are not limited to, at least one selected from the group consisting of: Basic Victoria Blue, Crystal Violet, Victoria Pure Blue, Indigo, Methyl Violet, Malachite Green, and Oil Pure Blue, e.g., those commercially available from Yantuo (Shanghai) Biotechnology Co., Ltd., Taifeng (Wuqiarig) Chemical Engineering Co., Ltd., and Baitiane (Shaoxing Economic Development Zone) Materials Co., Ltd.

In a preferable aspect, the negative photoresist may comprise 1 to 5 parts by weight of the phenolic hydroxyl-containing or carboxyl-containing film-forming resin, 5 to 9 parts by weight of the silicon-containing vinyl ether monomer, 0.2 to 0.5 parts by weight of the crosslinking agent, total 0.5 to 0.8 parts by weight of the photoacid generator and the additive, and 300 to 340 parts by weight of the organic solvent.

The negative photoresists in accordance with the embodiments of the present invention can be used for manufacture of array substrates, color filter substrates, and for other manufacture required to transfer particular high-precision pattern(s) onto the surface of substrates to be processed.

Figure 1:
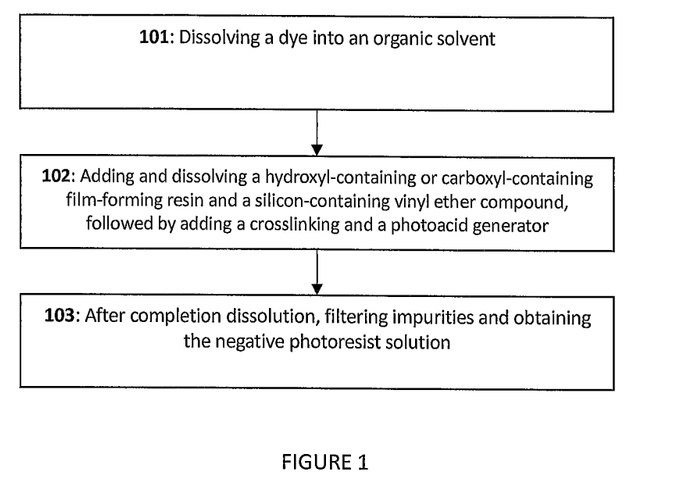
FIG. 1 is a schematic flowchart of a method of preparing a positive negative photoresist in accordance with the embodiments of the present invention.

Another embodiment of the present invention provides a method of preparing the aforesaid negative photoresist. Referring to FIG. 1, the method of preparing the negative photoresists in accordance with the embodiments of the present invention comprises:

101, dissolving a dye and a photoacid generator into an organic solvent;

102, adding and dissolving a hydroxyl-containing or carboxyl-containing film-forming resin and a silicon-containing vinyl ether monomer, followed by adding a crosslinking agent and a photoacid generator into the organic solvent; and 103, after complete dissolution, filtering purities contained therein to obtain a solution of the photoresist.

During practical production, the substances added into the organic solvent may contain some purities, which are thus required to be removed by filtration so as to produce the solution of the negative photoresist.

It is to be illustrated herein that the order of adding various substances into the organic solvent are not limited. Such substances may be added in accordance with the order from 101 to 103 or with any other order. The adding order is not limited herein.

Optionally, the solution of the negative photoresist as described above may further incorporate additive adjuvants, such as, leveling agents, defoaming agents, and/or dispersing agents. The leveling agents are used to enable the negative photoresist solution to form a flat, smooth, and uniform film layer; the defoaming agents are used to present the solution of the negative photoresist solution from generating bubbles and pinholes during film forming; and the dispersing agents are used to facilitate the uniform dispersion of the substances within the negative photoresist solution. These adjuvants may be added in accordance with practical requirements so that the formed negative photoresist solution exhibits improved properties. Of those, the negative photoresist may further incorporate additional adjuvants to impart more improved physical properties to the negative photoresist, and the adjuvants are not limited herein.

Figure 2:
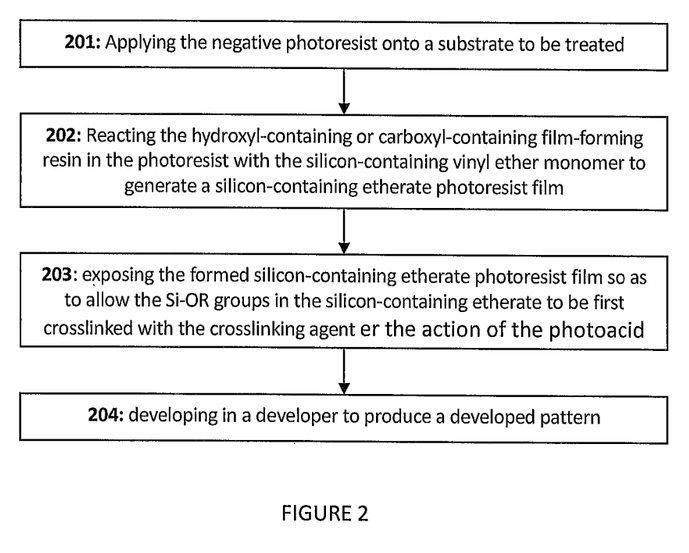
FIG. 2 is a schematic flowchart of a method of using a negative photoresist in accordance with the embodiments of the present invention.

Still another embodiment of the present invention further provides a method of using the negative photoresists in accordance with the present invention. Referring FIG. 2, the method comprises the steps of:

201, applying the negative photoresist onto a substrate to be treated;

202, reacting the hydroxyl-containing or carboxyl-containing film-forming resin in the negative photoresist with the silicon-containing vinyl ether monomer to generate a silicon-containing etherate photoresist film;

203, exposing the formed silicon-containing etherate photoresist film so as to allow the Si—OR groups in the silicon-containing etherate to be first crosslinked with the crosslinking agent in the presence of the photoacid generator; and

204, developing in a developer to produce a developed pattern.

As an example, the film-forming resin in the negative photoresist is a phenolic hydroxyl-containing or carboxyl-containing film-forming resin, which can be reacted the silicon-containing vinyl ether monomer at a temperature of 50° to 200° C. for 2 to 10 minutes to generate the silicon-containing etherate photoresist film. Of course, the phenolic hydroxyl-containing or carboxyl-containing film-forming resin can be reacted with the silicon-containing vinyl ether monomer under other conditions, as long as they can be reacted to generate the silicon-containing etherate photoresist film. The reaction conditions are not limited herein.

Preferably, the substrate coated with the negative photoresist may be baked in an air dry oven at a humidity of 50% to 90% and a temperature of 50° C. to 200° C. for 2 to 10 minutes, so that the negative photoresist on the substrate is reacted to generate the silicon-containing etherate photoresist film.

Under corresponding reaction conditions, the silicon-containing vinyl ether and the carboxyl-containing or phenolic hydroxyl-containing film-forming resin in the photoresist may be subject to an addition reaction. For example, It can be seen from the above reaction equations that, under a heating condition, both the carboxyl group and the phenolic hydroxyl group in the film-forming resin can be subject to an addition reaction with the silicon-containing vinyl ether to generate the silicon-containing etherate. For instance, the silicon-containing vinyl ether monomer and the carboxyl compound are formulated at a ratio of 1:9 to 1:1 to form a positive photoresist, and then the positive photoresist is applied onto a substrate, and undergoes heat curing to form the silicon-containing etherate film.

Upon exposure, as an example, the photoacid generator in the negative photoresist in the exposed area may produce a large amount of protonic acids. An exemplary photoacid generator is the oxime sulfate-based photoacid generator P-1 having the general structural formula of:

which follows the photolysis mechanism of:

-continued

It can be seen from the above photolysis mechanism that upon exposure, the photoacid generator P-1 first decomposes to generate sulfonate free radical and imine free radical, and meanwhile the sulfonate free radical absorbs hydrogen from the environment to produce sulfonic acid.

When the photoresist is a positive photoresist, the silicon-containing vinyl ether can be reacted with the carboxyl compound to generate the silicon-containing etherate photoresist film. In the exposure area under UV radiation, the silicon-containing etherate film undergoes a chemical change in the presence of the sulfonic acid derived from the photoacid generator to decompose and release alkali-soluble carboxyl groups, while the carboxyl groups in the unexposed area are still protected.

The exposure reaction mechanism is shown as follows:

After step 203, the solubility of the exposed and the unexposed areas in a basic developer will become substantially different. If the photoresist is a positive photoresist, then the exposed area will be dissolved in the basic developer more rapidly, and the unexposed area are hardly dissolved, thereby obtaining a positive image after developing in the basic developer. If the photoresist is a negative photoresist, then the exposed area will be dissolved in the basic developer more slowly, and the unexposed area will be dissolved rapidly, thereby obtaining a negative image after developing in the basic developer.

After obtaining the negative image of the negative photoresist, photoetching processes including etching, stripping, etc., may be carried out, thereby obtaining the final substrate having corresponding patterns.

Upon exposure, the silicon-containing etherate is reacted with the sulfonic acid derived from PAG (Photoacid generator) under exposure conditions, and the silicon-containing etherate will decompose to release alkali-soluble carboxyl groups.

When the photoresist is a negative photoresist comprising a crosslinking agent, in the presence of the sulfonic acid derived the acid generator in the exposed area, the Si—OR groups in the etherate produced by the addition reaction of the silicon-containing vinyl ether with the carboxyl compound do not first decompose, but are first crosslinked with the crosslinking agent (e.g., TMMGU) so that the solubility of the photoresist film in the exposed area will be substantially reduced.

The photoresists in accordance with the embodiments of the present invention and the methods of preparing and using the same utilize a photoresist formed by physically formulating a hydroxyl-containing or carboxyl-containing film-forming resin with a silicon-containing vinyl ether monomer. The photoresist is applied onto a substrate. At a high pre-baking temperature of the photoresist, the phenolic hydroxyl-containing or carboxyl-containing film-forming resin can be automatically reacted with the silicon-containing vinyl ether monomer to form a novel silicon-containing film-forming resin, thereby avoiding the separate step of synthesizing the silicon-containing polymeric film-forming resin of the prior art technology and saving the cost. Moreover, such process is easy to carry out, and thus can be widely used in the practical production.

EXAMPLES

The following examples are provided hereinafter to describe the present invention in details.

Example 1

0.4 g of Victoria Blue was dissolved into 300 g of ethylene glycol monoethyl ether. Then, 5 g of a carboxyl-containing novolac conforming to the structure of general formula 1 (wherein x was I, the average value of n was 3.5, the average value of p was 7.5, was n-butyl) was added. Next, 5 g of a silicon-containing vinyl ether conforming to the structure of general formula 2 (wherein n was 2, m was 1, $R_1$ is methyl) was added. Then, 0.2 g of TMMGU (a crosslinking agent) was added. Finally, 0.1 g of oxime sulfate A3-19 was added. After complete dissolution, the mixture was filtered with a filter paper to produce silicon-containing compound negative photoresist.

Example 2

0.3 g of Crystal Violet was dissolved into 250 g of ethylene glycol methyl ether and 90 g of methyl ether ketone. Then, 4 g of a carboxyl-containing novolac conforming to the structure of general formula 1 (wherein x was 2, the average value of n was 6, the average value of p was 11, $R_1$ was H) was added. Next, 6 g of a silicon-containing vinyl ether conforming to the structure of general formula 2 (wherein n was 2, m was 2, $R_2$ was phenyl) was added. Then, 0.4 g of TMMGU was added. Finally, 0.2 g of oxime sulfate A3-20 was added. After complete dissolution, the mixture was filtered with a filter paper to produce silicon-containing compound negative photoresist.

Example 3

0.3 g of Basic Victoria Blue was dissolved into 250 g of ethylene glycol methyl ether and 80 g of methyl ether ketone. Then, 3 g of a carboxyl-containing novolac conforming to the structure of general formula 1 (wherein x was 2, the average value of n was 8.5, the average value of p was 4.5, $R_1$ is methyl) was added. Next, 7 g of a silicon-containing vinyl ether conforming to the structure of general formula 2 (wherein n was 3, m was 3, $R_1$ is methyl) was added. Then, 0.3 g of TMMGU was added. Finally, 0.2 g of oniums A1-1 was added. After complete dissolution, the mixture was filtered with a filter paper to produce silicon-containing compound negative photoresist.

Example 4

0.4 g of Indigo was dissolved into 310 g of ethylene glycol ethyl ether. Then, 2 g of a carboxyl-containing novolac conforming to the structure of general formula 1 (wherein x was 2, the average value of n was 12.5, the average value of p was 11.5, $R_1$ was H) was added. Next, 8 g of a silicon-containing vinyl ether conforming to the structure of general formula 2 (wherein n was 2, m was 4, $R_1$ is methyl). Then, 0.3 g of TMMGU was added. Finally, 0.3 g of an arene-cyclopentadienyl iron A2-3 was added. After complete dissolution, the mixture was filtered with a filter paper to produce silicon-containing compound negative photoresist.

Example 5

0.4 g of Basic Victoria Blue was dissolved into 300 g of ethylene glycol methyl ether. Then, 1 g of a carboxyl-containing novolac conforming to the structure of general formula 1 (wherein x was 1, the average value of n was 12.5, the average value of p was 11.5, $R_1$, is methyl) was added. Next, 9 g of a silicon-containing vinyl ether conforming to the structure of general formula 2 (wherein n was 2, m was 4, $R_1$ is methyl). Then, 0.5 g of TMMGU was added. Finally, 0.4 g of oxime sulfate A3-18 was added. After complete dissolution, the mixture was filtered with a filter paper to produce the silicon-containing compound negative photoresist.

Test of Photoresist Properties

The silicon-containing compound negative photoresists produced in Examples 1 to 5 were applied onto silicon wafers with a diameter of 6 to 8 inches at 2,000 to 6,000 rpm, and then baked at a temperature of 50° C. to 200° C. for 2 to 10 minutes to form silicon-containing compound photoresist films. Next, the formed silicon-containing compound photoresist films were exposed in an exposure machine with exposure intensity of 60 to 80 mJ/cm². Then, the exposed films were developed in 2 wt % to 5 wt % of TMAH (Tetra methyl ammonium Hydroxide) solution for 20 seconds, and baked to dry. After drying, the photoresists were examined under an electronic microscope for their resolution. The results showed that the photoresists could exhibit a resolution of up to 2 to 3 and had good operation window of photoetching process. The specific process parameters and the results were shown in Table 1 below.

TABLE 1

Process Parameters and Results of Property Tests of Photoresists

| Example No. | Rotary Speed of Applying Operation (rpm) | Dimension of Silicon Wafer (Inch) | Baking Time (Minute) | Exposure Intensity (mJ/cm²) | Concentration of Developer (wt %) | Resolution (μm) | Exposure Result | Physical Property |
|---|---|---|---|---|---|---|---|---|
| 1 | 2000 | 8 | 10 | 180 | 5 | 4.3 | GOOD | GOOD |
| 2 | 4000 | 6 | 10 | 120 | 3 | 3.7 | GOOD | GOOD |
| 3 | 4000 | 6 | 10 | 120 | 3 | 3.2 | GOOD | GOOD |
| 4 | 4000 | 6 | 10 | 120 | 3 | 3.2 | GOOD | GOOD |
| 5 | 4000 | 6 | 6 | 120 | 3 | 3.0 | GOOD | GOOD |

It can be seen from the above results that the photoresists in accordance with the embodiments of the present invention can achieve a good resolution of up to 2 to 3 μm, and satisfy the technical standards during the practical production.

It can be seen from the above that the examples of the present invention utilize photoresists formed by physically formulating a hydroxyl-containing or carboxyl-containing film-forming resin with a silicon-containing vinyl ether monomer so that when the photoresist is applied onto a substrate and pre-baked at an elevated temperature, the hydroxyl-containing or carboxyl-containing film-forming resin can be automatically reacted with the silicon-containing vinyl ether monomer to form a novel silicon-containing film-forming resin to produce a novel silicon-containing film-forming resin. In the contrast, during the production of the prior art photoresists, it is required to polymerize first a silicon-containing acrylate-based monomer with a silicon-free monomer to form a silicon-containing polymer as the film-forming resin. Such polymerization is hard to occur, and has limited yield. Thus, the photoresists in accordance with the embodiments of the present invention avoid the separate step of synthesizing the silicon-containing polymeric film-forming resin of the prior art technology, save the cost, are easy to achieve, and thus can be widely used in the practical production.

The foregoing description are only particular embodiments of the present invention, but the scope of the present invention is not limited thereto. Any variation or replacement that persons skilled in the art can easily access in accordance with the present disclosure should be encompassed within the present invention. Therefore, the scope of the present invention should be defined by the appended claims.

The present invention claims the priority benefit of the Chinese Patent Application No. 201410037970.9 filed on Jan. 26, 2014, which is entirely incorporated herein by reference as a portion of the present description.

We claim:

1. A negative photoresist comprising:
   1 to 5 parts by weight of a film-forming resin, wherein the film-forming resin is a carboxyl-containing film-forming resin,
   5 to 9 parts by weight of a silicon-containing vinyl ether monomer,
   0.2 to 0.5 parts by weight of a crosslinking agent,
   0.5 to 0.8 part by weight of a photoacid generator and a dye, and
   300 to 340 parts by weight of an organic solvent capable of dissolving the aforesaid substances.

2. The negative photoresist of claim 1 wherein the carboxyl-containing film-forming resin comprises at least one selected from the group consisting of novolacs having pendant carboxyl groups, carboxyl-containing polyacrylate-based resins, and poly (vinyl acetal) carboxylic acid anhydride resin esters.

3. The negative photoresist of claim 2 wherein the novolacs having pendant carboxyl groups conforming to the general structural formula of:

wherein x is 0 to 2, n is 2 to 15, p is 0 to 13, $R_1$ is H or substituted or unsubstituted linear or branched $C_1$ to $C_9$ alkyl.

4. The negative photoresist of claim 1 wherein the silicon-containing vinyl ether monomer conforms to the general structural formula of:

wherein n is 2 to 10, m is 1 to 600, $R_1$ is $C_1$ to $C_9$ alkyl.

5. The negative photoresist of claim 1 wherein the crosslinking agent conform to the general structural formula of:

wherein $R_1$ is $C_1$ to $C_8$ alkyl, and $R_2$ is H or $CH_3$.

6. The negative photoresist of claim 1 wherein the photoacid generator comprises at least one selected from the group consisting of onium-based, arene-cyclopentadienyl iron-based, oxime sulfate-based and triazine-based photoacid generators.

7. A method of preparing a negative photoresist comprising:
   dissolving 1 to 5 parts by weight of a film-forming resin, 5 to 9 parts by weight of a silicon-containing vinyl ether monomer, and 0.2 to 0.5 parts by weight of a crosslinking agent, and total 0.5 to 0.8 part by weight of a photoacid generator and a dye into 300 to 340 parts by weight of an organic solvent capable of dissolving the aforesaid substances, wherein the film-forming resin is a carboxyl-containing film-forming resin.

8. The method of claim 7 wherein the carboxyl-containing film-forming resin comprises at least one selected from the group consisting of novolacs having pendant carboxyl groups, carboxyl-containing polyacrylate-based resins, and poly (vinyl acetal) carboxylic acid anhydride resin esters.

9. The method of claim 8 wherein the novolacs having pendant carboxyl groups conforms to the general structural formula of:

wherein x is 0 to 2, n is 2 to 15, p is 0 to 13, $R_1$ is H or substituted or unsubstituted linear or branched $C_1$ to $C_9$ alkyl.

10. The method of claim 7 wherein the silicon-containing vinyl ether monomer conforms to the general structural formula of:

wherein n is 2 to 10, m is 1 to 600, $R_1$ is $C_1$ to $C_9$ alkyl.

11. The method of claim 7 wherein the crosslinking agent conforms the general structural formula of:

wherein $R_1$ is $C_1$ to $C_8$ alkyl, and $R_2$ is H or $CH_3$.

12. A method of forming a pattern comprising:
applying the negative photoresist of claim 1 onto a substrate;
heating the carboxyl-containing film-forming resin in the photoresist with the silicon-containing vinyl ether monomer to form a silicon-containing etherate photoresist film;
exposing the formed silicon-containing etherate photoresist film so as to allow Si—OR groups in the silicon-containing etherate to be first crosslinked with the crosslinking agent in the presence of a photoacid generator; and
developing in a developer to produce a developed pattern.

* * * * *